United States Patent [19]
Hammerschmid

[11] Patent Number: 5,974,803
[45] Date of Patent: Nov. 2, 1999

[54] THERMOGENERATOR FOR POWER PRODUCTION IN CONJUNCTION WITH A HEATING DEVICE

[75] Inventor: Günther Hammerschmid, Buchenhain, Germany

[73] Assignee: Webasto Thermosysteme GmbH, Stockdorf, Germany

[21] Appl. No.: 09/059,559

[22] Filed: Apr. 14, 1998

[30] Foreign Application Priority Data

Apr. 17, 1997 [DE] Germany .......................... 197 15 989

[51] Int. Cl.⁶ .................................................. F01K 1/00
[52] U.S. Cl. ................................................ 60/643
[58] Field of Search ........................... 60/643, 655

[56] References Cited

U.S. PATENT DOCUMENTS

| | | | |
|---|---|---|---|
| 3,617,390 | 11/1971 | Bucs et al. ............................... | 136/211 |
| 3,651,641 | 3/1972 | Ginter ..................................... | 60/39.26 |
| 3,719,532 | 3/1973 | Falkenberg et al. ..................... | 136/208 |
| 5,644,185 | 7/1997 | Miller ...................................... | 310/306 |

FOREIGN PATENT DOCUMENTS

| | | |
|---|---|---|
| 0290833 | 4/1988 | European Pat. Off. . |
| 1952740 | 10/1969 | Germany . |
| 4042015 | 7/1991 | Germany . |

*Primary Examiner*—Hoang Nguyen
*Attorney, Agent, or Firm*—Sixeby, Friedman, Leedom & Ferguson; David S. Safran

[57] ABSTRACT

The invention relates to a thermogenerator for power production in conjunction with a heating device of the combustion type, the hot contact point of at least one thermocouple of the thermogenerator being at a flue gas collection box and the cold contact point of thermocouple being on a heat exchange medium collection box. To guarantee high efficiency of the thermogenerator with a compact structure, it is made as a block-shaped module with plate-shaped thermocouple units sandwiched between the flue gas collection box and the heat exchange medium collection box.

15 Claims, 1 Drawing Sheet

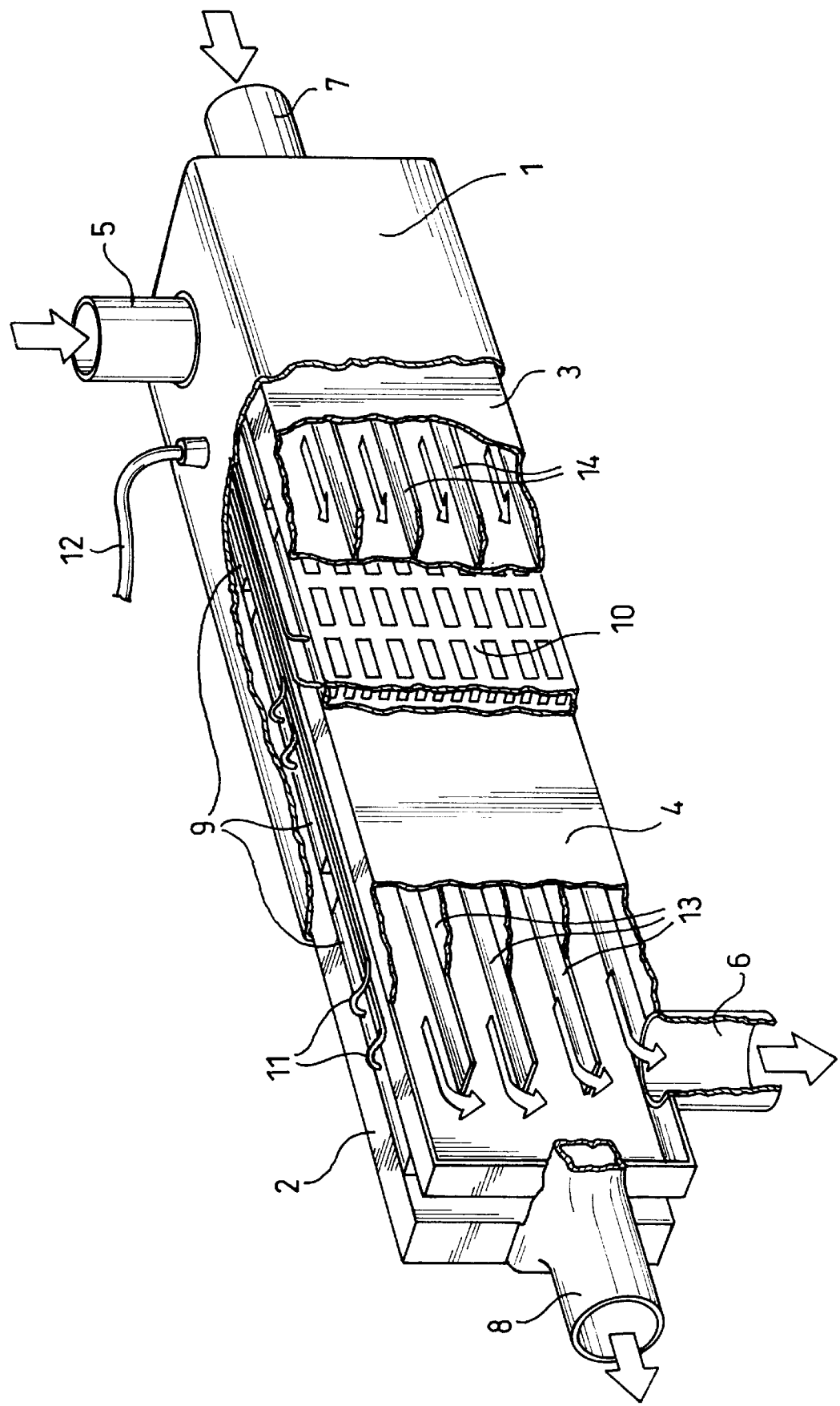

THERMOGENERATOR FOR POWER PRODUCTION IN CONJUNCTION WITH A HEATING DEVICE

BACKGROUND OF THE INVENTION

1. Field of the Invention

The invention relates to a thermogenerator for power production in conjunction with a heating device of the combustion type, the hot contact point of at least one thermocouple of the thermogenerator being at the flue gas vent of the heating device and the cold contact site of the thermocouple being on the flow channel for a heat exchange medium of the heating device.

2. Description of Related Art

A thermogenerator of the type to which this invention is directed is known from published German Patent Application DE 40 42 015 A1. Two points for location of the thermocouple are suggested. According to one placement suggestion, the hot contact point of the thermocouple adjoins the combustion chamber, while its cold contact point is located in the flow path of the heat exchanger medium, between an inlet-side radial fan and an area of the flow channel, adjacent to the combustion chamber of the heating device. According to another placement suggestion, the hot contact point of the thermocouple is in thermal contact with the hot flue gas discharged through the flue gas vent and with the hot contact points bordering the inlet side of the flow channel. Special measures for coupling of the contact surfaces of the thermocouple to the hot and cold points of the heating device are not addressed. This means that the thermocouple is essentially in a clamp seat between hot and cold points of the heating device by which only relatively small contact surfaces are formed. As a result, electric power generation by the temperature difference between the hot and cold sides of the thermocouple is greatly limited. Thus, the suggestion in this publication changes nothing fundamental herein, accordingly ribs for heat transfer are provided which are optionally in direct contact with the flue gas or the heat exchanger medium.

Another thermogenerator for power production in conjunction with a heating device is described in the published European Patent Application No. EP 0 290 833 A2. Its thermocouple is formed as a plate-shaped semiconductor component with the side to be heated which is either in the radiant area of the flame of the heating device or in its exhaust stream, and with a cold side located in the inlet area of the still cold heat transfer medium or in the area of the ambient air.

German Patent DE 195 27 740 C1 discloses a circuit of solar cells which are series connected into two groups which are switched in parallel to adapt to the current/voltage characteristic of the respective load, the solar cells in the two groups having different no-load voltages. In this case, the series connection in each group with a lower no-load voltage can be formed selectively in solar cells of the same no-load voltage by a smaller number or in solar cells of different voltage by the same number of solar cells with lower no-load voltage.

SUMMARY OF THE INVENTION

The primary object of the present invention is to provide a thermogenerator for power production in conjunction with a heating device of the combustion type in which energy production is optimized as compared to a conventional thermogenerator, and which, therefore, assures increased efficiency with a compact structure.

This object is achieved in accordance with the present invention, in an arrangement in which the hot contact point of at least one thermocouple unit of the thermogenerator is at the flue gas vent of the heating device and the cold contact point of the thermocouple is on the flow channel for the heat exchanger medium of the heater, by at least one thermocouple unit being made as a plate-shaped thermocouple module that is sandwiched between a flue gas collection box located in the flue gas line and a heat exchanger medium collection box located in the flow channel.

More specifically, the thermogenerator of the invention is made in the form of a module which has a laminar structure in which there is at least one plate-shaped thermocouple unit sandwiched between two collection boxes which have relatively large contact surfaces and through which, on the one hand, flue gas, and on the other, a heat exchange medium flow. Due to the large contact surfaces, a correspondingly large electrical energy can be obtained from the heat difference between the relatively cool heat exchanger medium and relatively hot flue gas, so that high efficiency is ensured for the thermogenerator of the invention.

Advantageously, the thermogenerator module is surrounded by a housing, has an elongated shape and on the longitudinal ends is provided with the respective inlets and outlets for the flue gas and heat exchanger medium.

To ensure that the heat exchanger medium or flue gas covers the contact surfaces of the respective collection boxes in their entirety, it is advantageously provided that guide ribs for establishing separate flow paths for the flue gas or heat exchanger medium are provided between the inlet and outlet, and which extend preferably essentially over the entire length of the module between the respective collection box inlet and outlet.

The capacity of the module-shaped thermogenerator of the invention can be significantly increased by providing several flue gas/heat exchanger medium collection boxes with a sandwich-like inclusion of several thermocouples in a layer sequence or in a stack. One especially preferred configuration, in this case, is the central arrangement of a flue gas collection box with two outside heat exchange medium collection boxes and thermocouples located in between, or vice versa, and with a centrally arranged heat exchange medium collection box and two outside flue gas collection boxes with thermocouples located between them. As compared to the simple version of the module-shaped thermogenerator with one flue gas collection box and heat exchanger medium collection box, energy production can be significantly increased thereby.

According to another advantageous embodiment of the invention, between the two "hot" and "cold" collection boxes in the flow direction of these boxes, there are several adjoining plate-shaped thermocouples which cover the entire contact surface of the collection boxes and which are electrically wired in a suitable manner to produce the desired voltage.

Depending on the load to be supplied with the generated voltage, advantageously, a special interconnection of several thermocouples is proposed. To achieve temperature differences that are as uniform as possible, or electrical voltages that are as uniform as possible, the number and/or thickness and/or area of the heat exchange ribs on them are chosen to be different on the thermocouples or by means of the individual identical thermocouples. The voltage generation of all thermocouples which is as constant as possible and which is achieved thereby is especially suited for battery charging, for example, of a motor vehicle.

Alternatively, according to the present invention, remodulation of the load characteristic, for example, a motor vehicle fan, is suggested; accordingly, the individual thermocouples of the same size which produce different voltages and which are exposed to different temperature differences are connected in parallel in groups for matching to the variation of the load characteristic, the thermocouples within one group being series connected. This is already known for solar cells from the above-mentioned German Patent DE 195 27 740 C1. Group formation is advantageously produced such that the thermocouples generate essentially the same voltage within the same group.

Preferably, the thermocouples of the thermocouple units are made as Peltier elements.

These and further objects, features and advantages of the present invention will become apparent from the following description when taken in connection with the accompanying drawings which, for purposes of illustration only, show a single embodiment in accordance with the present invention.

BRIEF DESCRIPTION OF THE DRAWINGS

The sole FIGURE of the drawings shows a partial cutaway perspective view of a preferred embodiment of a thermogenerator module in accordance with the present invention.

DETAILED DESCRIPTION OF THE PREFERRED EMBODIMENT

The thermogenerator shown in the FIGURE has a housing 1 of an elongated rectanguloidal shape, and is, preferably, made of sheet metal. In the housing 1, there are heat exchanger medium collection boxes 2 and 3 and a flue gas collection box 4, all of which are, likewise, of generally the same longitudinal rectanguloidal shape. Flue gas collection box 4 is located between heat exchanger medium collection boxes 2 and 3 with a lateral spacing therebetween, and has an inlet 5 and an outlet 6 which are located in respective end areas of the housing 1 and which project up or down from it in the shape of pipe stubs. The two heat exchanger medium collection boxes 2 and 3, preferably, share a common inlet 7 and a common outlet 8 that are, likewise, in the form of a pipe stub located on the front or back end of housing 1, flush with its longitudinal center axis.

Between the outside heat exchanger medium collection box 2 and central flue gas collection box 4, there is a total of three plate-shaped thermocouple units which are jointly labeled with reference number 9. In mirror image thereto, there are likewise three thermocouple units between the outside heat exchanger medium collection box 3 and the central flue gas collection box 4, only one thermocouple unit 10 of which can be seen the FIGURE. The thermocouple units 9, 10 are identical having a plate shape and a plurality of thermocouple elements 10a, such as Peltier elements, the contact faces 10b of the thermocouple units 9, 10 being in close contact with the adjoining walls of collection boxes 2, 3 and 3, 4, respectively. The thermocouples of the thermocouple units 9, 10 are thus exposed on one side to relatively hot flue gas which flows through flue gas collection box 4, as shown by the arrows at inlet 5 and outlet 6 of this collection box, and on their other side, with the relatively cooler heat exchanger medium which flows through the heat exchanger medium collection boxes 2, 3, as shown schematically by arrows on inlet 7 and on outlet 8 of these boxes. Thermocouple units 9, 10, based on the temperature difference acting on them, conventionally generate voltages which are tapped via the electrical lines 11 shown leading from the thermocouple units 9, 10. These lines 11 are wired to one another so that, via an output line 12, a desired output voltage can be tapped which, optionally, is matched, by suitable interconnection of thermocouples 9, 10, to the characteristic of a load to be supplied with power, as was explained above.

Within flue gas collection box 4 and within heat exchanger medium collection boxes 2 and 3, there are partitions or fins 13, 14 which run in the longitudinal direction of the thermogenerator module and which extend essentially over the entire length of these boxes. The respective medium or gas in these boxes flows over the entire length of the contact surfaces provided by these partitions or fins 13, 14 so that optimum, i.e., large area, heat exchange is ensured with all of thermocouple elements of the thermocouple units 9, 10.

To achieve temperature differences that are as uniform as possible, or electrical voltages that are as uniform as possible, the number and/or thickness and/or area of the heat exchange ribs 13, 14 can be varied, for example, to provide a greater contact area at the cooler areas than at the hotter ones. Likewise, the use of thermocouples with different thermoelectric conversion properties or differing numbers of individual identical thermocouples in respective thermocouple units 9, 10 can achieve a similar balancing effect. By attaining such a voltage generation from all of thermocouple units which is as constant as possible, a thermogenerator is achieved that is especially suited for battery charging, for example, of a motor vehicle.

Alternatively, according to the present invention, remodulation of the load characteristic, for example, a motor vehicle fan, is suggested; accordingly, the individual thermocouples of the same size which produce different voltages and which are exposed to different temperature differences are connected in parallel in groups for matching to the variation of the load characteristic, the thermocouples within one group being series connected. This is already known for solar cells from the above-mentioned German Patent DE 195 27 740 C1. Group formation is advantageously produced such that the thermocouples generate essentially the same voltage within the same group.

As the heat exchange medium, preferably water is used, inlet 7 and outlet 8 preferably being connected to the flow pipe to the heater (motor vehicle heater).

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

I claim:

1. A thermogenerator for power production in conjunction with a heating device of the combustion type, comprising a block-shaped module containing a flue gas collection box located in a flue gas line, at least one heat exchange medium collection box located in a flow channel and a plate-shaped thermocouple unit, having at least one thermocouple, sandwiched between the flue gas collection box and the heat exchange medium collection box, a hot contact point of said at least one thermocouple being at a side wall of the flue gas collection box and the cold contact point of the at least one thermocouple being on the heat exchange medium collection box.

2. Thermogenerator as claimed in claim 1, wherein said at least one thermocouple unit extends over equally sized contact surfaces of the collection boxes.

3. Thermogenerator as claimed in claim 1, wherein the collection boxes have an inlet and outlet located in opposite end regions thereof.

4. Thermogenerator as claimed in claim 1, wherein flow guide ribs are disposed in the collection boxes for establishing separate flow paths between the inlet and outlet and increasing heat exchange between the flow and said side walls of the collection boxes.

5. Thermogenerator as claimed in claim 4, wherein the flow guide ribs extend essentially over the entire length between the inlet and outlet of the collection boxes.

6. Thermogenerator as claimed in claim 1, wherein said at least one heat exchange medium collection box comprises two heat exchange medium collection boxes and wherein a plurality of thermocouple units are sandwiched between each heat exchange medium collection box and the flue gas collection box.

7. Thermogenerator as claimed in claim 6, wherein the flue gas collection box is located centrally between the heat exchange medium collection boxes and the thermocouple units are located on both sides the flue gas collection box.

8. Thermogenerator as claimed in claim 6, wherein collection boxes are surrounded by common housing.

9. Thermogenerator as claimed in claim 6, wherein said thermocouples cover substantially the entire sidewalls of the collection boxes between inlets and outlets thereof.

10. Thermogenerator as claimed in claim 6, wherein to achieve electrical voltages that are as uniform as possible from thermocouple units at least one of the number, thickness and area of the heat exchanger ribs are varied.

11. Thermogenerator as claimed in claim 6, wherein individual thermocouples of the thermocouple units which are of the same size but produce different voltages due to exposure to different temperature differences are connected in parallel in groups for matching to an intended power output, the thermocouples within each group being connected in series.

12. Thermogenerator as claimed in claim 11, wherein thermocouples which are combined into a group generate essentially the same voltage.

13. Thermogenerator as claimed in claim 6, wherein to achieve temperature differences that are as uniform as possible between the hot and cold contact points of the thermocouples, at least one of the number, thickness and area of the heat exchanger ribs are varied.

14. Thermogenerator as claimed in claim 6, wherein the thermocouples are Peltier elements.

15. Thermogenerator as claimed in claim 1, wherein said at least one thermocouple comprises a Peltier element.

* * * * *